United States Patent
Chen et al.

(10) Patent No.: US 9,648,775 B2
(45) Date of Patent: May 9, 2017

(54) TOOL-LESS STORAGE DEVICE ADAPTOR TRAY WITH SPRING MECHANISM

(71) Applicant: SUPER MICRO COMPUTER, INC., San Jose, CA (US)

(72) Inventors: Richard Chen, San Jose, CA (US); Lawrence H. Liang, San Jose, CA (US); Che-ming Yang, Palo Alto, CA (US)

(73) Assignee: SUPER MICRO COMPUTER, INC, San Jose, CA (US)

(*) Notice: Subject to any disclaimer, the term of this patent is extended or adjusted under 35 U.S.C. 154(b) by 0 days.

(21) Appl. No.: 14/802,959

(22) Filed: Jul. 17, 2015

(65) Prior Publication Data
US 2017/0020018 A1    Jan. 19, 2017

(51) Int. Cl.
G06F 1/16      (2006.01)
H05K 7/14      (2006.01)
F16M 13/02     (2006.01)

(52) U.S. Cl.
CPC ........... *H05K 7/1417* (2013.01); *F16M 13/02* (2013.01)

(58) Field of Classification Search
CPC combination set(s) only.
See application file for complete search history.

(56) References Cited

U.S. PATENT DOCUMENTS

| | | | | |
|---|---|---|---|---|
| 6,141,222 A * | 10/2000 | Toor | ......................... | G06F 1/184 312/223.1 |
| 6,172,870 B1 * | 1/2001 | Novotny | ................. | G06F 1/187 361/679.37 |
| 6,236,563 B1 * | 5/2001 | Buican | .................... | G06F 1/184 312/333 |
| 7,204,469 B2 * | 4/2007 | Chen | ....................... | G06F 1/187 248/694 |
| 8,094,446 B2 * | 1/2012 | Liu | ......................... | G06F 1/187 361/679.33 |
| 8,320,118 B2 * | 11/2012 | Chuang | ................ | G11B 33/124 211/26 |
| 8,644,017 B2 * | 2/2014 | Dunham | ................. | G06F 1/183 361/679.33 |
| 2005/0066346 A1 * | 3/2005 | Wang | ................... | H05K 7/1489 720/657 |
| 2006/0007650 A1 * | 1/2006 | Shim | ....................... | G06F 1/187 361/679.33 |
| 2007/0070595 A1 * | 3/2007 | Chen | ...................... | G06F 1/187 361/679.37 |
| 2007/0236878 A1 * | 10/2007 | Lin | ......................... | G06F 1/184 361/679.33 |
| 2012/0091304 A1 * | 4/2012 | Chuang | .................... | F16B 2/10 248/316.5 |

\* cited by examiner

*Primary Examiner* — Lisa Lea Edmonds
(74) *Attorney, Agent, or Firm* — Artegis Law Group, LLP

(57) ABSTRACT

A storage device tray has a form factor designed to support a larger storage device, and is configured to secure a small storage device, thereby acting as an adapter between storage device sizes. The storage device tray includes a clip configured with pegs that may couple to screw hole sin the storage device. The clip also exerts a force against the storage device to secure that storage device. At least one advantage of this approach is that a storage device can be coupled to a storage device tray without using screws.

20 Claims, 7 Drawing Sheets

TOOL-LESS STORAGE DEVICE ADAPTOR TRAY WITH SPRING MECHANISM

BACKGROUND OF THE INVENTION

Field of the Invention

Embodiments of the present invention relate generally to storage device trays, and, more specifically, to a tool-less storage device adapter tray.

Description of the Related Art

A conventional mass storage device may be a hard disk drive (HDD) or a solid-state drive (SSD). Storage devices such as HDDs and SSDs are typically manufactured with standardized 2.5-inch and 3.5-inch form factors. Such conventional storage devices can be coupled to a computing device via a storage device tray. The storage device is usually mounted to the tray using screws, and the tray is then mounted within the computing device.

Conventional storage device trays are typically designed with a large form factor that is capable of housing 3.5-inch storage devices, and computing devices are generally designed to accept storage device trays having this larger form factor. The larger form factor storage device tray not only provides sufficient space for 3.5-inch storage devices, the design also provides sufficient space to house the smaller 2.5-inch storage devices. A 2.5-inch storage device can be mounted within the larger form factor storage device tray using mounting brackets and four small screws. The mounting brackets can be coupled within the storage device tray and provide a stable mounting point. The screws are inserted through screw holes in the mounting brackets, and then tightened into a sink in the storage device to secure the device within. Thus, a larger form factor storage device tray may act as an adapter between a 2.5-inch storage device and a computing device that accepts storage device trays designed to accommodate 3.5-inch storage devices.

One drawback associated with traditional adapter trays is that, as described above, mounting the 2.5-inch storage device within the tray requires a number of small screws in order to securely fasten the storage device. Mounting the storage device using these small screws is tedious and time-consuming and also prone to error. These issues are compounded with larger server machine implementations where tens or hundreds of 2.5-inch storage devices may be deployed.

As the foregoing illustrates, what is needed in the art is a technique for mounting a storage device having a small form factor within a storage device tray designed with a larger form factor.

SUMMARY OF THE INVENTION

One embodiment of the present invention sets forth a storage device tray, including a sideplate, a baseplate, and a clip coupled to the baseplate and configured to exert a force against a storage device to secure the storage device against the sideplate.

At least one advantage of this approach is that a storage device can be coupled to a storage device tray without using screws. Further, the storage device can be securely mounted to the tray much faster than possible with conventional approaches, which require numerous screws to be tightened

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

Figure 1:
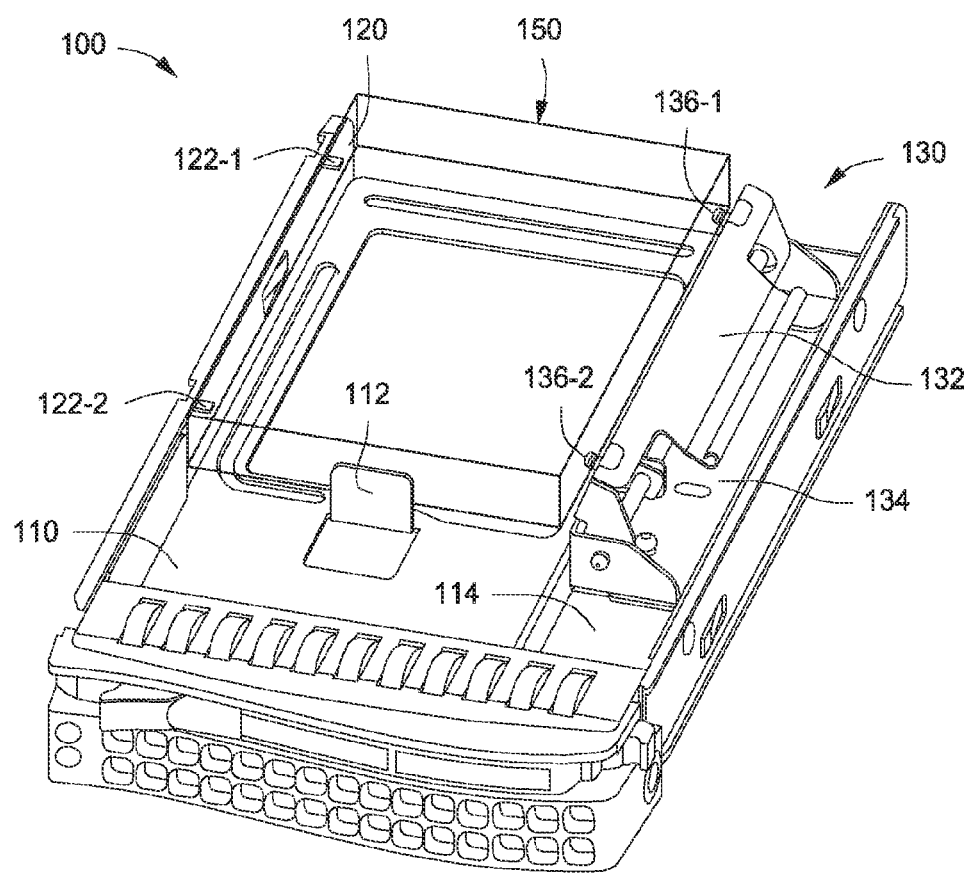
FIG. 1 is a conceptual drawing illustrating a storage device tray from a first perspective configured to securely house a small storage device, according to one embodiment of the present invention.

FIG. 1 is a conceptual drawing illustrating a storage device tray from a first perspective configured to securely house a small storage device, according to one embodiment of the present invention. As shown, storage device tray 100 includes a baseplate 110, a sideplate 120, and a clip assembly 130. Baseplate 110 includes a boss 112 and a channel 114. Sideplate 120 includes pegs 122-1 and 122-2. Clip assembly 130 resides within channel 114 and includes a clip 132 coupled to a bracket 134. Bracket 134 is mounted within channel 114 to baseplate 110. Clip 132 includes pegs 136-1 and 136-2. Pegs 136, as well as pegs 122 mentioned above, generally do not have screw threads, and may thus be referred to as being "threadless." Clip 132 is shown to reside in an "open" configuration. When clip 132 resides in a "closed" configuration, clip assembly 130 securely mounts a storage device 150 within storage device tray 150.

In one embodiment, storage device 150 may be a small (i.e. 2.5-inch) storage device, such as a 2.5-inch hard disk drive (HDD) or 2.5-inch solid-state drive (SSD). Although storage device tray 100 may be configured to mount a 2.5-inch storage device, storage device tray 100 may have an external form factor that is comparable to trays which house larger storage devices, such as 3.5-inch storage devices. Thus, storage device tray 100 acts as an adapter for converting between 2.5-inch and 3.5-inch form factors. Further, storage device tray 100, configured to mount storage device 150, may be interchanged with other storage device trays housing storage devices of other sizes.

In operation, clip assembly 130 allows storage device 150 to be mounted to and removed from storage device tray 100 without the need for manipulating any screws. In order to mount storage device 150 within storage device tray 100, a user exerts force on a top surface of clip 132. When the exerted force overcomes the resistance of torsional springs internal to clip assembly 130, clip 132 rotates and opens. The user may then position storage device 150 to insert pegs 122-1 and 122-2 into screw holes within storage device 150. In doing so, the user may slide storage device 150 into storage device 100 until boss 112 prevents further movement of storage device 150.

Then, the user may release clip 132. The torsional springs cause clip 132 to rotate towards storage device 150, and pegs 136-1 and 136-2 are then introduced into screw holes in storage device 150. Clip 132 then exerts force against storage device 150, in response to the torsional springs, which secures pegs 122-1, 122-2, 136-1, and 136-2 within the aforesaid screw holes in storage device 150. In this configuration, storage device 150 may be securely mounted within storage device tray 100. To remove storage device 150 from storage device tray 110, the user need only exert force against clip 132 and then remove storage device 150.

An advantage of storage device tray 100 is that storage devices having smaller form factors than 3.5-inches may be mounted within that storage device tray, and then mounted within computing devices configured to receive trays designed for the 3.5-inch form factor. Furthermore, storage device tray 100 provides an entirely tool-less approach to mounting a storage device to a tray, which obviates the need for tools as well as tool usage. Thus, a user can mount storage device 150 to storage device tray 100 using only their hands and without needing to fasten screws. An important outcome of this approach is that storage devices having a 2.5-inch form factor can be quickly mounted to trays and then coupled to computing devices, greatly expediting the swapping of storage devices.

Figure 2:
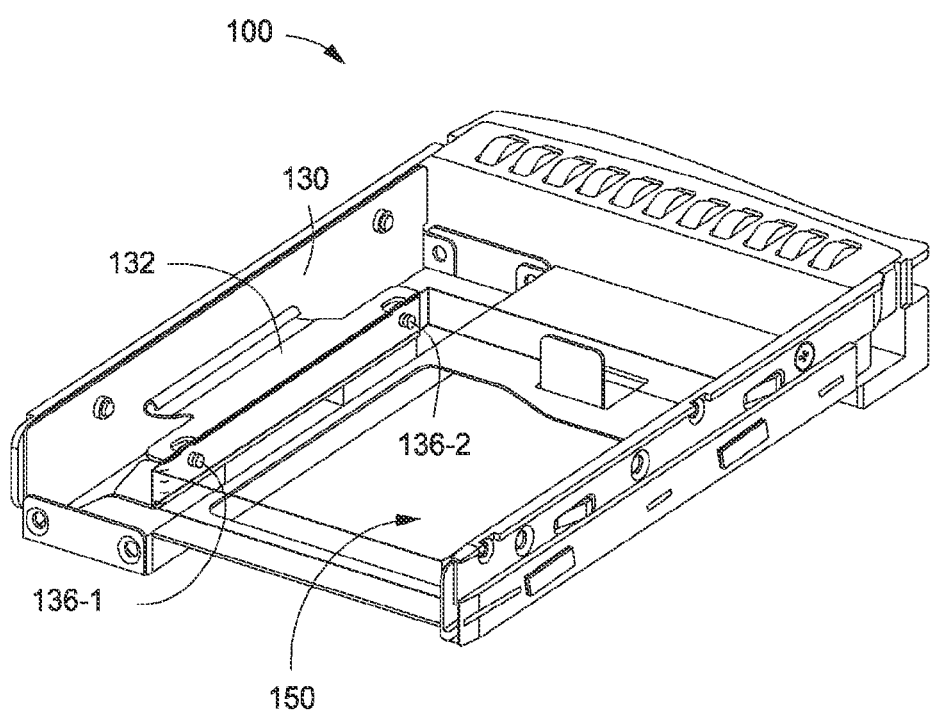
FIG. 2 is a conceptual diagram illustrating the storage device tray of FIG. 1 from a second perspective, according to one embodiment of the present invention.

FIG. 2 is a conceptual diagram illustrating the storage device tray of FIG. 1 from a second perspective, according to one embodiment of the present invention. FIG. 2 illustrates the same components as FIG. 1, including clip assembly 130, clip 132, and pegs 136-1 and 136-2. As also shown, clip 132 is closed, thereby securely mounting storage device 150. Clip assembly 130 and clip 132 are described in greater detail below in conjunction with FIG. 3.

Figure 3:
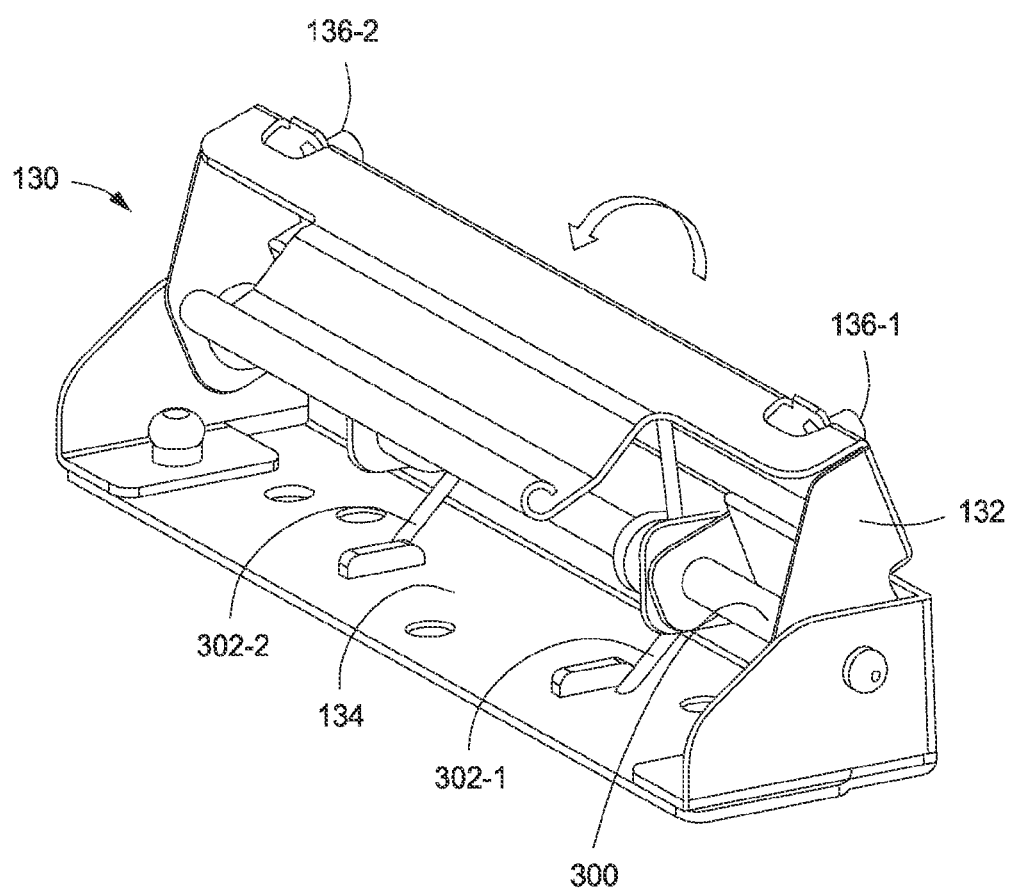
FIG. 3 is a conceptual diagram illustrating a single-spring clip assembly of FIG. 1, according to one embodiment of the present invention.

FIG. 3 is a conceptual diagram illustrating a single-spring clip assembly of FIG. 1, according to one embodiment of the present invention. As shown, clip assembly 130 includes some of the same components as those shown in FIGS. 1-2. In addition, clip assembly 130 also includes a pin 300 and torsional springs 302-1 and 302-2. Pin 300 is configured to couple clip 132 to bracket 134. Clip 132 is configured to rotate around pin 300 relative to bracket 134. Bracket 134 may be coupled to baseplate 110 in the fashion shown in FIGS. 1-2. Torsional springs 302-1 and 302-3 exert torsional force between clip 132 and bracket 134.

Each torsional spring 302 is wrapped around pin 300 one or more times and fastened to both clip 132 and bracket 134. With this configuration, torsional spring 302 exerts a torsional force against clip 132, relative to bracket 134, which causes clip 132 to rotate around pin 300. If a user exerts force against clip 132, then clip may rotate in the opposite direction, in the fashion shown. Thus, user may open clip 132 by pressing on clip 132, and allow clip 132 to close by releasing clip 132.

Figure 4:
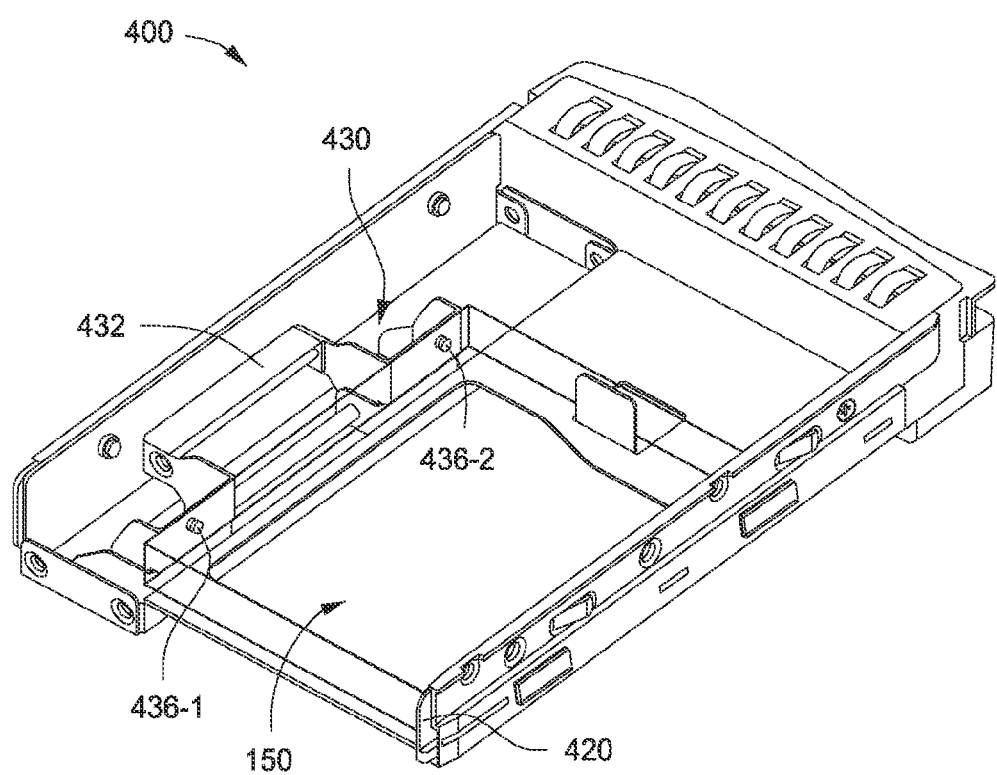
FIG. 4 is a conceptual drawing illustrating a storage device tray configured to securely house a small storage device, according to another embodiment of the present invention.

An advantage of clip assembly 130 is that clip 132 may secure storage device 150 via just one spring and without the need for any screws. Torsional spring 302 is generally capable of exerting sufficient force to close clip 132 tightly against storage device 150. In addition, pegs 136-1 and 136-2 are sized appropriately to fit within screw holes in storage device 150, without the need for actual screws. Thus, usage of clip assembly 130 is simple and convenient compared to prior art approaches. FIG. 4 illustrates another implementation of a storage device tray, as described in greater detail below.

FIG. 4 is a conceptual drawing illustrating a storage device tray configured to securely house a small storage device, according to another embodiment of the present invention. As shown, storage device tray 400 has a similar form factor as storage device tray 100 shown in FIG. 1. Storage device tray 400 includes a sideplate 420 and a clip assembly 430. Clip assembly 430 includes a clip 432 coupled to a bracket 434, as well as threadless pegs 436-1 and 436-2. Clip assembly 430 also includes a torsional spring (not shown here) that causes clip 432 to rotate and exert force against storage device 150, thereby securing that storage device.

In operation, a user exerts force on a top surface of clip 432 to overcome the resistance of the torsional spring internal to clip 430, thereby causing clip 432 to rotate and open. The user may then position storage device 150 to introduce threadless pegs (not shown) protruding from sideplate 420 into screw holes within storage device 150. Then, the user releases clip 432. The torsional spring causes clip 432 to rotate towards storage device 150, and pegs 436-1 and 436-2 are then introduced into screw holes in storage device 150. The torsional spring within clip assembly 430 causes clip 432 to exert force against storage device 150, which secures storage device 150 within storage device tray 400. To remove storage device 150 from storage device tray 110, the user need only exert force against clip 432 and then remove storage device 150. Clip assembly 430 is described in greater detail below in conjunction with FIG. 5.

Figure 5:
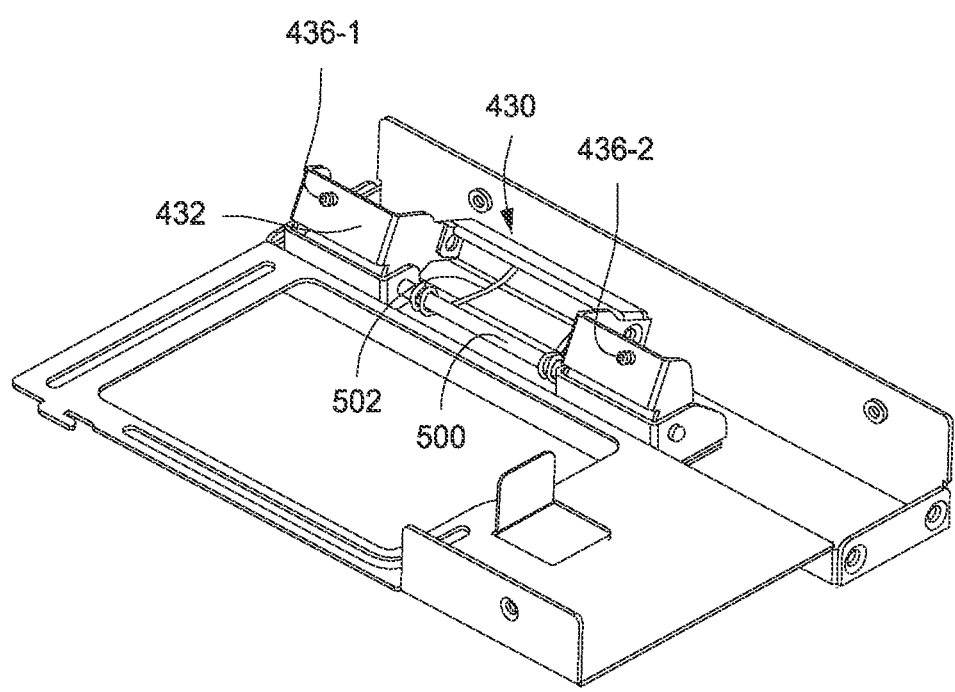
FIG. 5 is a conceptual drawing illustrating the dual-spring clip assembly of FIG. 4, according to one embodiment of the present invention.

FIG. 5 is a conceptual drawing illustrating the dual-spring clip assembly of FIG. 4, according to one embodiment of the present invention. As shown, clip assembly 430 includes some of the same components as shown in FIG. 4. In addition, clip assembly 430 also includes a pin 500 and a torsional spring 502. Pin 500 is configured to couple clip 432 to bracket 434. Clip 432 is configured to rotate around pin 300 relative to bracket 134. Torsional spring 502 exerts a torsional force between clip 432 and bracket 434.

Figure 6:
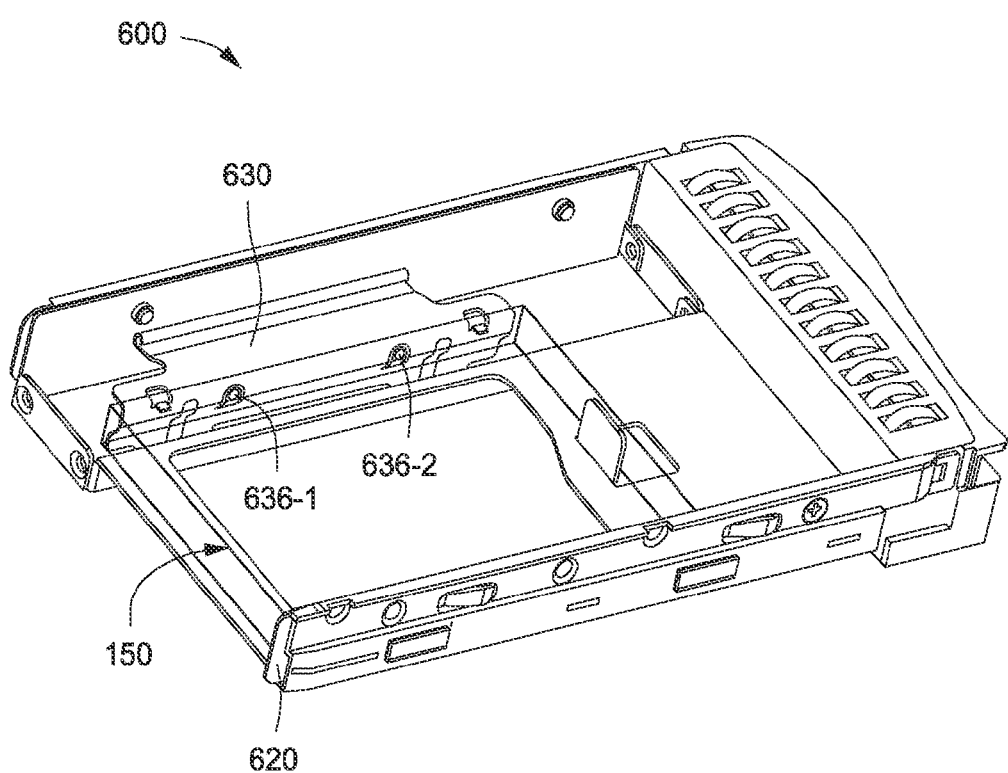
FIG. 6 is a conceptual drawing illustrating a storage device tray configured to securely house a small storage device, according to yet another embodiment of the present invention.

Torsional spring 502 is wrapped around pin 500 one or more times and fastened to both clip 432 and bracket 434. With this configuration, torsional spring 502 exerts a torsional force against clip 432, relative to bracket 434, which causes clip 432 to rotate around pin 500. If the user exerts force against clip 432, then clip may rotate in the opposite direction, in the fashion shown. Thus, user may open clip 432 by pressing on clip 432, and allow clip 432 to close by releasing clip 432. FIG. 6 illustrates another implementation of a storage device tray, as described in greater detail below.

FIG. 6 is a conceptual drawing illustrating a storage device tray configured to securely house a small storage device, according to yet another embodiment of the present invention. As shown, clip 632 includes threadless pegs 636-1 and 636-2. Clip 630 has a specific geometry that allows clip 630 to securely mount storage device 150 in similar fashion as clip assemblies 130 and 430 described above. However, clip 632 is not an assembly, but rather a single piece of metal.

A user may open clip 632 by exerting a force against a top surface of clip 632. In response, clip 632 may deform sufficiently to allow storage device 150 to be positioned in the fashion shown. Upon release of clip 632, pegs 636-1 and 636-2 are introduced into screw holes within storage device 150, and threadless pegs (not shown) within sideplate 620 are similarly introduced into corresponding screw holes. The user may release storage device 150 by exerting force against clip 632.

Figure 7:
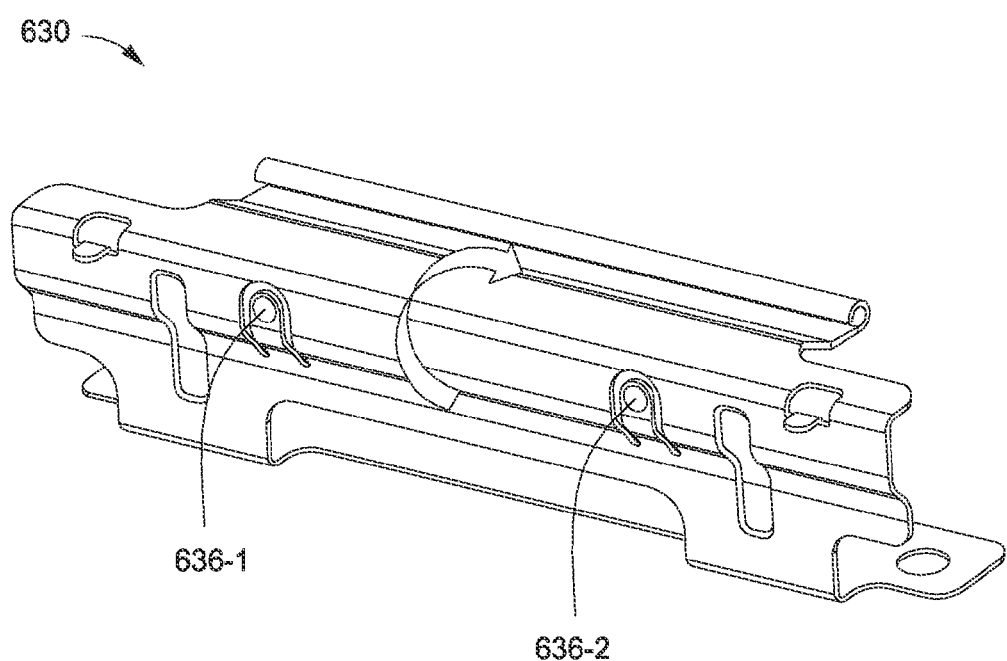
FIG. 7 is a conceptual diagram illustrating the spring-less clip of FIG. 6, according to one embodiment of the present invention.

FIG. 7 is a conceptual diagram illustrating the spring-less clip of FIG. 6, according to one embodiment of the present invention. As shown, clip 632 may be operated in similar fashion as clip assemblies 130 and 430 described previously. When the user exerts a force against the top surface of clip 632, clip 632 deforms and rotates in the fashion shown.

An advantage of the spring-less design discussed herein is that clip 632 may be manufactured with relative, by simply stamping and bending a single piece of metal. This process may be cheaper and require less production time compared to other approaches. Further, lacking assembled pieces, clip 632 may also be more robust and less prone to breakage.

In sum, a storage device tray has a form factor designed to support a larger storage device, and is configured to secure a small storage device, thereby acting as an adapter between storage device sizes. The storage device tray includes a clip configured with pegs that may couple to screw hole sin the storage device. The clip also exerts a force against the storage device to secure that storage device.

At least one advantage of this approach is that a storage device can be coupled to a storage device tray without using screws. Further, the storage device can be securely mounted to the tray much faster than possible with conventional approaches, which require numerous screws to be tightened. By implementing the techniques described herein, a computing device can be configured and re-configured with storage devices of different sizes.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

The invention claimed is:

1. A storage device tray, comprising:
a sideplate;
a baseplate; and
a clip coupled to the baseplate and configured to exert a force against a storage device to secure a side of the storage device opposite the clip against the sideplate.

2. The storage device tray of claim 1, wherein the clip includes a first threadless peg configured to be introduced into a first screw hole within the storage device when the clip exerts the force against the storage device.

3. The storage device tray of claim 1, wherein the sideplate includes a second threadless peg configured to be introduced into a second screw hole within the storage device when the clip exerts the force against the storage device.

4. The storage device tray of claim 1, wherein the clip is included within a clip assembly that includes:
the clip;
a bracket;
a pin configured to couple to the clip to the bracket; and
a first torsional spring that surrounds at least a portion of the pin and is configured to exert a torsional force between the clip and the bracket to cause the clip to exert the force against the storage device.

5. The storage device tray of claim 4, wherein the clip assembly further comprises a second torsional spring that surrounds at least a portion of the pin and is configured to exert a torsional force between the clip and the bracket to cause the clip to exert the force against the storage device.

6. The storage device tray of claim 1, wherein the clip comprises a single piece of metal configured to deform in order to exert a spring force against the storage device.

7. The storage device tray of claim 1, wherein the storage device tray has a form factor capable of housing a 3.5-inch storage device.

8. The storage device tray of claim 7, wherein the storage device comprises a 2.5-inch storage device.

9. The storage device tray of claim 1, wherein the storage device is configured to be released from the storage device tray when another force is exerted against a top surface of the clip to counter the force exerted by the clip.

10. The storage device tray of claim 9, wherein the clip is configured to rotate away from the storage device when the another force is exerted against the top surface of the clip.

11. A clip, comprising:
a first surface coupled to a baseplate of a storage device tray; and
a second surface configured to exert a force against a storage device to secure a side of the storage device opposite the clip against a sideplate of the storage device tray.

12. The clip of claim 11, wherein the clip includes a first threadless peg configured to be introduced into a first screw hole within the storage device when the second surface exerts the force against the storage device.

13. The clip of claim 11, wherein the sideplate includes a second threadless peg configured to be introduced into a second screw hole within the storage device when the second surface exerts the force against the storage device.

14. The clip of claim 11, wherein the clip is included within a clip assembly that includes:
the clip;
a bracket;
a pin configured to couple to the clip to the bracket; and
a first torsional spring that surrounds at least a portion of the pin and is configured to exert a torsional force between the clip and the bracket to cause the second surface to exert the force against the storage device.

15. The clip of claim 14, wherein the clip assembly further comprises a second torsional spring that surrounds at least a portion of the pin and is configured to exert a torsional force between the clip and the bracket to cause the second surface to exert the force against the storage device.

16. The clip of claim 11, wherein the clip comprises a single piece of metal configured to deform in order to exert a spring force against the storage device.

17. The clip of claim 11, wherein the storage device tray has a form factor capable of housing a 3.5-inch storage device.

18. The clip of claim 17, wherein the storage device comprises a 2.5-inch storage device.

19. The clip of claim 11, wherein the storage device is configured to be released from the storage device tray when another force is exerted against the first surface to counter the force exerted by the second surface.

20. The clip of claim 19, wherein the clip is configured to rotate away from the storage device when the another force is exerted against the top surface of the clip.

* * * * *